United States Patent [19]

Uno et al.

[11] Patent Number: 5,043,609
[45] Date of Patent: Aug. 27, 1991

[54] UHF BAND TRANSISTOR MIXER CIRCUIT

[75] Inventors: Masao Uno; Takashi Hiroshima, both of Nagaokakyo, Japan

[73] Assignee: Murata Manufacturing Co., Ltd., Japan

[21] Appl. No.: 479,333

[22] Filed: Feb. 13, 1990

[30] Foreign Application Priority Data

Feb. 13, 1989 [JP] Japan .................................. 1-33229

[51] Int. Cl.$^5$ ........................ H03D 13/00; H03K 9/06
[52] U.S. Cl. .................................. 307/529; 307/219.1; 307/271; 328/15; 328/156; 333/218
[58] Field of Search ...................... 307/219.1, 529, 525, 307/524, 271, 556; 328/156, 165, 15; 332/107, 123; 333/218; 331/43

[56] References Cited

U.S. PATENT DOCUMENTS

| | | | |
|---|---|---|---|
| 3,177,378 | 4/1965 | Pulfer et al. | 307/529 |
| 3,921,056 | 11/1975 | Mahoney | 333/218 |
| 4,403,156 | 9/1983 | Sakamoto | 307/525 |
| 4,684,833 | 8/1987 | Rinderle | 307/525 |
| 4,713,556 | 12/1987 | Yamamoto et al. | 307/529 |

FOREIGN PATENT DOCUMENTS

| | | |
|---|---|---|
| 855985 | 12/1960 | United Kingdom . |
| 940503 | 10/1963 | United Kingdom . |
| 953126 | 3/1964 | United Kingdom . |
| 1104928 | 3/1968 | United Kingdom . |

Primary Examiner—Stanley D. Miller
Assistant Examiner—Richard Roseen
Attorney, Agent, or Firm—Ostrolenk, Faber, Gerb & Soffen

[57] ABSTRACT

A UHF band transistor mixer circuit includes a frequency converting transistor to a base of which a received high-frequency signal and a local oscillation signal are applied. A collector of the frequency converting transistor is connected to a low-pass filter from which a desired frequency signal, i.e., an intermediate frequency signal is outputted. A series resonance circuit having a series resonance frequency point existing in a frequency region between both the signals is connected between an emitter of the frequency converting transistor and a reference potential.

1 Claim, 2 Drawing Sheets

UHF BAND TRANSISTOR MIXER CIRCUIT

BACKGROUND OF THE INVENTION

1. Field of the Invention

The present invention relates generally to UHF band transistor mixer circuits. More particularly, the present invention relates to UHF band transistor mixer circuit (referred to as "mixer circuit" hereinafter) comprising an input matching circuit of a high-pass filter type having its input portion connected through a coupling capacitor to an input terminal which is applied with a received high-frequency signal and a local oscillation signal, a frequency converting transistor having its base connected to an output portion of the above input matching circuit, and a low-pass filter having its input portion connected to a collector of the frequency converting transistor.

2. Description of the Prior Art

Mixer circuits of this type heretofore known include one shown in FIG. 3. In FIG. 3, the reference character IN denotes an input terminal which is applied with a received high-frequency signal having a frequency of fa (for example, 800 MHz) and a local oscillation signal having a frequency of fb (for example, 890 MHz) from a high-frequency amplifier (not shown) and a local oscillation circuit (not shown), respectively, the reference character HF denotes an input matching circuit of a high-pass filter type having its input portion connected to the input terminal IN through a coupling capacitor C1, and the reference character TR denotes a frequency converting transistor having its base connected to an output portion of the input matching circuit HF.

The input matching circuit HF comprises a strip-line inductor L1 inserted in series between the coupling capacitor C1 and the base of the frequency converting transistor TR, and a strip-line inductor L2 and a capacitor C2 for correcting input matching which are connected in series with each other to be inserted between the coupling capacitor C1 and a ground portion. The reference characters R1 and C3 respectively denote an emitter resistor and an alternating-current bypass capacitor which are connected in parallel with each other to be inserted between an emitter of the frequency converting transistor TR and the ground portion.

The reference character LF denotes a type low-pass filter LF which comprises a coil L3 inserted in series between the collector of the frequency converting transistor TR and an output terminal OUT and capacitors C4 and C5 connected between respective ends of the coil L3 and the ground portion.

The reference characters R2 and R3 denote resistors for dividing a direct-current voltage from a direct-current power source +B, the reference character L4 denotes a choke coil for cutting an output of the low-pass filter LF, and the reference character C6 denotes a bypass capacitor for cutting ripple components or the like of the direct-current power source +B.

In a conventional mixer circuit having such construction, the received high-frequency signal and the local oscillation signal which are inputted from the input terminal IN are matched in the input matching circuit HF and then, injected into the base of the frequency converting transistor TR. In this frequency converting transistor TR, both the above signals are frequency-converted into signals having two frequencies of (fa+fb) and (fa−fb) (i.e., 800 MHz+890 MHz=1690 MHz and 890 MHz−800 MHz=90 MHz) by utilizing a non-linear active region thereof. Only the signal of (fa−fb) which is a desired frequency of two frequency-converted outputs, i.e., a signal component of 90 MHz (referred to as "desired signal component" hereinafter) is outputted from the output terminal OUT via the low-pass filter LF as an intermediate frequency signal to be inputted to an intermediate frequency amplifier (not shown).

In addition, in such a mixer circuit, the input matching circuit HF is formed as a high-pass filter type so as to prevent the signal of (fa−fb) which is the output of the low-pass filter LF, i.e., the desired signal component of 90 MHz from being returned to the base of the frequency converting transistor TR from the input terminal IN through the input matching circuit HF, that is, prevent the desired signal component from being reflected at the input terminal IN and inputted to the base of the frequency converting transistor TR.

FIG. 4 is a diagram of return loss characteristics showing the return loss relative to the frequency in the input matching circuit HF. This return loss can be derived by measuring the absolute value of the impedance in a high-frequency circuit, which shows to what extent a reflected wave is attenuated with respect to an incident wave. According to the return loss characteristics, the return loss becomes approximately zero relative to a frequency of 750 MHz or less, particularly the desired signal component of 90 MHz. Accordingly, the desired signal component is not reflected from the input terminal IN, and therefore, the same is not to be returned to the base of the frequency converting transistor TR.

Furthermore, the return loss becomes approximately 8 to 10 dB relative to a frequency region of 750 MHz or more, i.e., a received high-frequency signal of 800 MHz and a local oscillation signal of 890 MHz. Accordingly, both the signals are efficiently transmitted and injected to the base of the frequency converting transistor TR through the input terminal IN.

As described above, the input matching circuit HF is formed as a high-pass filter type so as to prevent the return of the desired signal component of 90 MHz. In the conventional example, however, unnecessary signals of 750 MHz or more outside the respective frequency regions of the received high-frequency signal and the local oscillating signal are passed over a wide band, as shown in FIG. 4. Accordingly, input matching characteristics in the input matching circuit HF is somewhat inferior, thereby encountering a problem of adversely affecting characteristics such as the noise figure, conversion gain and intermodulation in the mixer circuit.

SUMMARY OF THE INVENTION

Therefore, a principal object of the present invention is to provide a UHF band transistor mixer circuit in which the above described respective characteristics can be improved by improving return loss characteristics in the respective frequency bands of the received high-frequency signal and the local oscillation signal.

In order to attain such an object, the present invention provides a UHF band transistor mixer circuit comprising an input matching circuit of a high-pass filter type having its input portion connected through a coupling capacitor to an input terminal which is applied with a received high-frequency signal and a local oscillation signal, a frequency converting transistor having its base connected to an output portion of the above input matching circuit of a high-pass filter type, and a low-pass filter having its input portion connected to a collector of the frequency converting transistor, which is characterized in that a series resonance circuit having a series resonance frequency point existing in a frequency region between the above signals is connected between an emitter of the above frequency converting transistor and a reference potential.

In accordance with the present invention, since the series resonance circuit is connected between the emitter of the frequency converting transistor and the reference potential, and the series resonance frequency point thereof is set between respective frequency regions of the received high-frequency signal and the local oscillation signal. Accordingly, an emitter impedance of the frequency converting transistor becomes small at a frequency between both the frequency regions, and therefore, the return loss at the frequencies between both the frequency regions are increased. As a result, the transmission efficiency of the above described signals to the base of the frequency converting transistor is improved, resulting in improvement in respective characteristics in the mixer circuit.

The objects and other objects, features, aspects and advantages of the present invention will become more apparent from the following detailed description of the embodiments of the present invention when taken in conjunction with accompanying drawings.

DETAIL DESCRIPTION OF THE PREFERRED EMBODIMENTS

Figure 1:
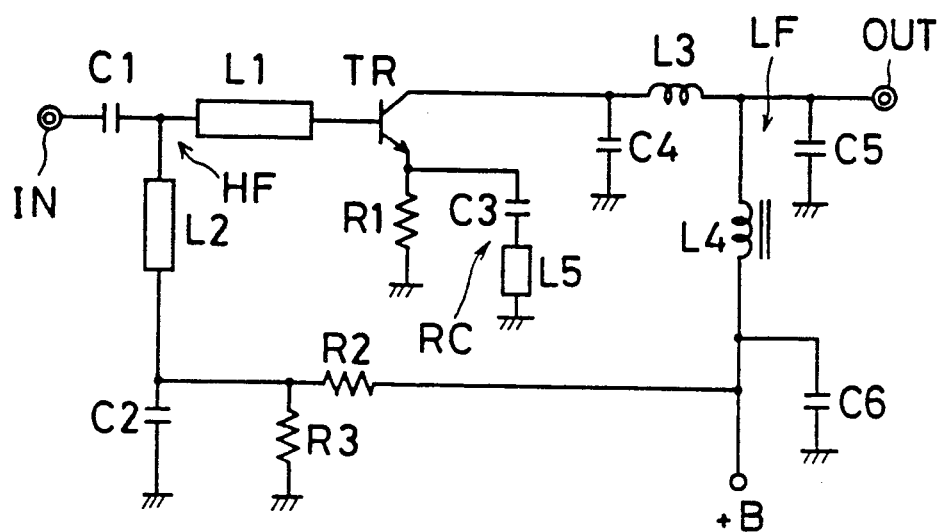
FIG. 1 is a circuit diagram illustrating a mixer circuit according to an embodiment of the present invention.
Figure 3:
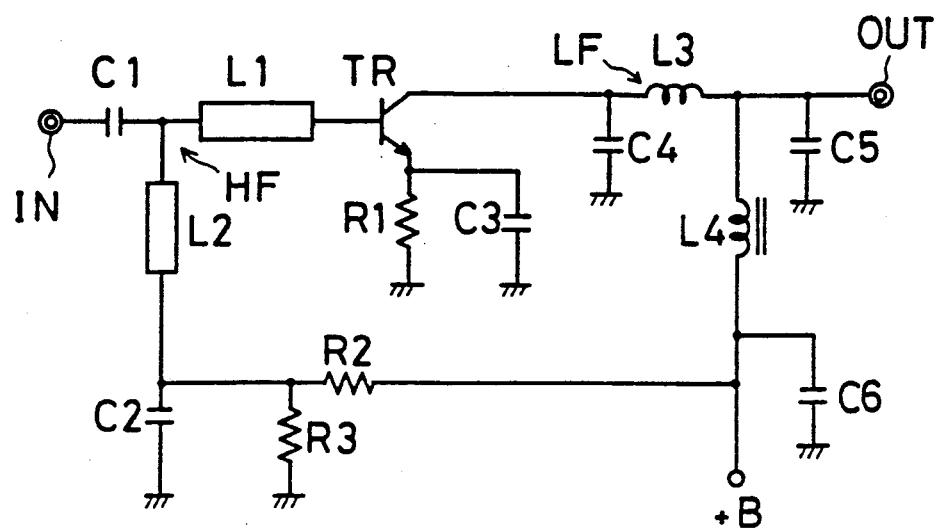
FIG. 3 is a circuit diagram illustrating a conventional mixer circuit.
Figure 4:
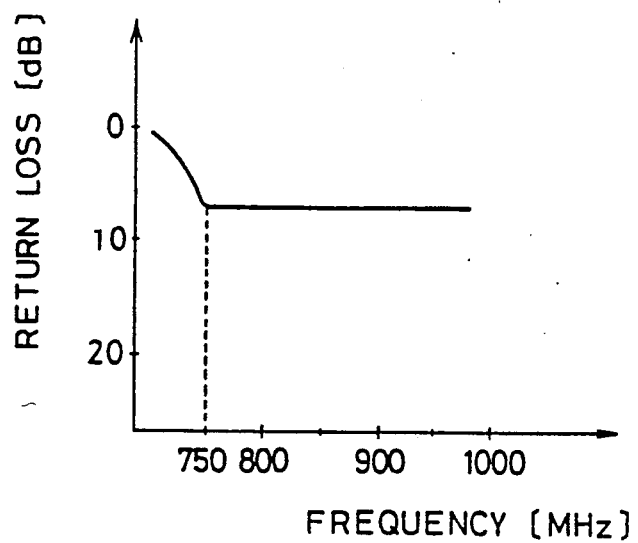
FIG. 4 is a diagram showing return loss characteristics in the conventional mixer circuit.

FIG. 1 is a circuit diagram illustrating a mixer circuit according to an embodiment of the present invention, in which the same reference characters are assigned to the same circuit elements as those in the conventional mixer circuit shown in FIG. 3, and therefore, the description of the circuit elements having the same reference characters is not repeated.

The mixer circuit according to the present embodiment shown in FIG. 1 has the following construction which is different from that of the conventional mixer circuit. More specifically, in the mixer circuit according to the present embodiment, a series resonance circuit RC having a series resonance frequency point existing in a frequency region between a received high-frequency signal and a local oscillation signal is connected between an emitter of the frequency converting transistor TR and a reference potential, i.e., a ground portion in this embodiment.

The series resonance circuit RC in the mixer circuit according to the present embodiment is constructed by connecting a strip-line inductor L5 having a small inductance value, for example, approximately 0.3 to 3 nH to the alternating-current bypass capacitor C3 of the frequency converting transistor TR.

Figure 2:
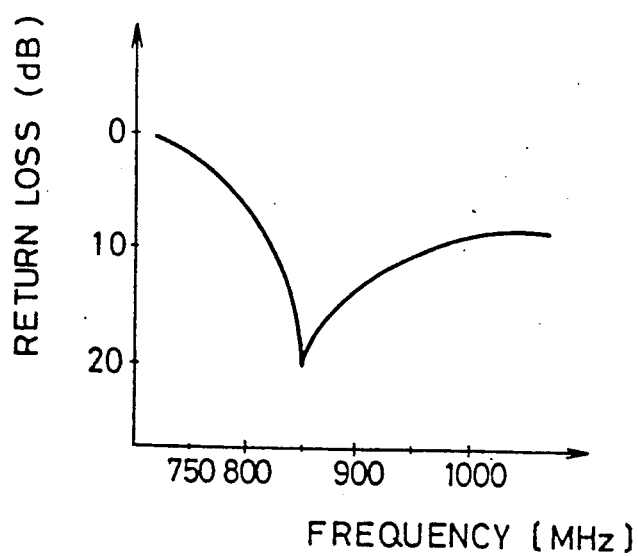
FIG. 2 is a diagram showing return loss characteristics in the mixer circuit according to the embodiment.

In the mixer circuit having the above series resonance circuit RC, the return loss characteristics are obtained by superposing the return loss characteristics in the series resonance circuit RC with the return loss characteristics in the input matching circuit HF. Therefore, in the mixer circuit according to the present embodiment, as shown in FIG. 2, the return losses in the respective frequency regions of the received high-frequency signal and the local oscillation signal become approximately 20 dB, resulting in superior return loss characteristics. Consequently, input matching characteristics in the input matching circuit HF are improved, resulting in improvement in characteristics such as the nose figure, conversion gain and etc. in the mixer circuit.

In the embodiment shown in FIG. 1, an NPN transistor is used as the frequency converting transistor; however, it is needless to say that a PNP transistor may be used for such a frequency converting transistor. In the case of the PNP transistor, the direct-current voltage source may be $-B$, and the emitter of the transistor may be connected to $+B$ or a ground level through the series resonance circuit.

In addition, a strip-inductor is used for forming the series resonance circuit; however, an inductor of coil type may be used.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A UHF band transistor mixer circuit, comprising:
   an input matching circuit of a high-pass filter type having its input portion connected through a coupling capacitor to an input terminal which is applied with received high-frequency signal and a local oscillation signal;
   a frequency converting transistor having its base connected to an output portion of said input matching circuit;
   a low-pass filter having its input portion connected to a collector of said frequency converting transistor; and
   a series resonance circuit having a series resonance frequency point existing in a frequency region between said signals, said series resonance circuit being connected between an emitter of said frequency converting transistor and a reference potential.

* * * * *